United States Patent
Hwang et al.

(10) Patent No.: US 7,010,012 B2
(45) Date of Patent: Mar. 7, 2006

(54) METHOD AND APPARATUS FOR REDUCING SPECULAR REFLECTIONS IN SEMICONDUCTOR LASERS

(75) Inventors: Wen-Yen Hwang, Sugar Land, TX (US); Stefan J. Murry, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 223 days.

(21) Appl. No.: 09/917,068

(22) Filed: Jul. 26, 2001

(65) Prior Publication Data

US 2003/0035454 A1 Feb. 20, 2003

(51) Int. Cl.
*H01S 5/00* (2006.01)
*H01S 3/08* (2006.01)

(52) U.S. Cl. .............................. 372/99; 372/92; 372/98; 372/43

(58) Field of Classification Search ................. 372/43, 372/92, 98, 99, 48, 50, 54, 63, 68, 96; 438/29, 438/46
See application file for complete search history.

(56) References Cited

U.S. PATENT DOCUMENTS

| | | | | |
|---|---|---|---|---|
| 5,007,708 A | * | 4/1991 | Gaylord et al. | 359/569 |
| 5,061,874 A | | 10/1991 | Hecq et al. | |
| 5,804,818 A | | 9/1998 | Kaplan | |
| 5,820,957 A | | 10/1998 | Schroeder et al. | |
| 5,837,561 A | * | 11/1998 | Kish et al. | 438/47 |
| 5,986,205 A | | 11/1999 | Matsune et al. | |
| H1856 H | | 9/2000 | Baldasara et al. | |
| 6,545,296 B1 | * | 4/2003 | Mukaihara et al. | 257/79 |
| 6,562,644 B1 | * | 5/2003 | Ishida et al. | 438/29 |

\* cited by examiner

*Primary Examiner*—Minsun Oh Harvey
*Assistant Examiner*—Armando Rodriguez
(74) *Attorney, Agent, or Firm*—N. Stephan Kinsella; Ari Pramudji

(57) ABSTRACT

The present invention is directed a method of fabricating a VCSEL. First, a substrate with a back surface and a front surface is provided. Then, a first reflector, an active region, and a second reflector are disposed on the front surface. The first reflector is disposed on the front surface. The active region is interposed between the first reflector and the second reflector. Then, anti-reflection features are formed into the back surface of the substrate to reduce specular reflection of light into the active region.

14 Claims, 3 Drawing Sheets

METHOD AND APPARATUS FOR REDUCING SPECULAR REFLECTIONS IN SEMICONDUCTOR LASERS

BACKGROUND OF THE INVENTION

1. Field of the Invention

This invention relates generally to devices that emit electromagnetic radiation and, in particular, to vertical-cavity surface-emitting lasers (VCSELs).

2. Description of the Related Art

The following descriptions and examples are not admitted to be prior art by virtue of their inclusion within this section.

Laser beams are reflected to some extent from any surface contacted. If the reflected rays remain parallel (i.e., the angle of reflection equals the angle of incidence), the reflection is called "specular". This means that the rays striking the surface are reflected from the surface according to the law of reflection, qi=qr. If the reflected rays are randomly scattered, the reflection is called "diffuse". Specular reflections are produced by highly-polished, mirror-like surfaces whereas diffuse reflections result from rough, irregular surfaces (however, specular reflections can also be produced by rough surfaces when the size of the surface irregularities is less than the wavelength of the incident radiation). The distinction between a specular reflection and a diffuse reflection is not always clearly defined. Except for reflections from precisely constructed optical mirrors, all beams are to some extent divergent. In general, however, the rougher the reflecting surface, the greater will be the divergence (or diffuseness) of the reflected beam. FIG. 1 illustrates various types of laser reflections. FIG. 2 illustrates specular reflection from a polished mirror surface. FIG. 3 illustrates diffuse reflection from a corrugated surface.

Lasers have a wide range of industrial and scientific uses. There are several types of lasers, including gas lasers, solid-state lasers, liquid (dye) lasers, and free electron lasers. Semiconductor lasers are also in use. The possibility of amplification of electromagnetic waves in a semiconductor superlattice structure, i.e., the possibility of semiconductor diode lasers, was predicted in a seminal paper by R. F. Kazarinov, et al., "Possibility of the Amplification of Electromagnetic Waves in a Semiconductor with a Superlattice," Soviet Physics Semiconductors, vol. 5, No. 4, pp. 707–709 (October 1971). Semiconductor laser technology has continued to develop since this discovery.

There are a variety of types of semiconductor lasers. Semiconductor lasers may be diode lasers (bipolar) or non-diode lasers such as quantum cascade (QC) lasers (unipolar). Semiconductor lasers of various types may be electrically pumped (by a DC or AC current), or pumped in other ways, such as by optically pumping (OP) or electron beam pumping. Semiconductor lasers are used for a variety of applications and can be built with different structures and semiconductor materials, such as gallium arsenide (GaAs).

Semiconductor lasers are typically powered by applying an electrical potential difference across the active region, which causes a current to flow therein. Electrons in the active region attain high energy states as a result of the potential applied. When the electrons spontaneously drop in energy state, photons are produced (to carry away the energy lost by the transition, so as to conserve energy). Some of those photons travel in a direction perpendicular to the reflectors of the laser. As a result of the ensuing reflections, the photons can travel through the active region multiple times.

Stimulated emission occurs when an electron is in a higher energy level and a photon with an energy equal to the difference between the electron's energy and a lower energy interacts with the electron. In this case, the photon stimulates the electron to fall into the lower energy state, thereby emitting a photon. The emitted photon will have the same energy as the original photon, and, if viewed as waves, there will be two waves emitted (from the electron's atom) in phase with the same frequency. Thus, when the photons produced by spontaneous electron transition photons interact with other high energy state electrons, stimulated emission can occur so that two photons with identical characteristics are present. If most electrons encountered by the photons are in the high energy state, the number of photons traveling between the reflectors tends to increase, giving rise to amplification of light and thus lasing.

The use of semiconductor diode lasers (both edge-emitting and surface-emitting) for forming a source of optical energy is attractive for a number of reasons. For example, diode lasers have a relatively small volume and consume a small amount of power as compared to conventional laser devices. Further, the diode laser is a monolithic device, and does not require a combination of a resonant cavity with external mirrors and other structures to generate a coherent output laser beam.

Additionally, semiconductor lasers may be edge-emitting lasers or surface-emitting lasers (SELs). Edge-emitting semiconductor lasers output their radiation parallel to the wafer surface, while in SELs, the radiation output is perpendicular to the wafer surface.

One type of SEL is the vertical-cavity surface-emitting laser (VCSEL). The VCSEL structure usually consists of an active (optical gain) region sandwiched between two distributed Bragg reflector (DBR) mirrors: a top, exit DBR, and a bottom DBR. DBRs are sometimes referred to as mirror stacks. The DBR mirrors of a typical VCSEL can be constructed from dielectric or semiconductor layers (or a combination of both, including metal mirror sections). DBRs or mirror stacks in VCSELs are typically formed of multiple pairs of layers often referred to as mirror pairs. The pairs of layers are formed of a material system generally consisting of two materials having different indices of refraction and being easily latticed matched to the other portions of the VCSEL. The number of mirror pairs per stack may range from 20–40 pairs to achieve a high percentage of reflectivity, depending on the difference between the refractive indices of the layers. A larger number of mirror pairs increases the percentage of reflected light (reflectivity).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top DBR mirror has a reflectivity that may be 98%–99.5% (depending on the details of the laser design). Of course, various laser structures may vary from these general properties.

High reflectivity (approaching 100%) at the bottom DBR mirror is generally desired in a VCSEL for two reasons. First, any portion of the optical field that "leaks" out the back of the bottom DBR mirror represents a power loss that reduces efficiency. This reduced efficiency may be so great so as to prevent the laser from operating at all (i.e. the efficiency goes to zero). A second reason why nearly unity reflection coefficient is desired for the bottom DBR mirror is related to the issue of optical feedback into the laser cavity.

From the standpoint of optics, any change in the index of refraction along the path of a light ray can be interpreted as a mirror, i.e., any change in the refractive index at an interface will cause some light to be reflected from the surface, rather than transmitted through. For the simple case of a ray of light normally incident to a semiconductor, the proportion of the light intensity reflected back from the interface is given by the equation:

$$R = \frac{(n-1)^2 + k^2}{(n+1)^2 + k^2}$$

where n is defined as the index of refraction that describes the semiconductor optical properties, while k is the extinction coefficient. Any light that is not reflected by the bottom DBR mirror will be transmitted through the semiconductor for some distance (if k is zero for the substrate material, then it will be transmitted essentially without loss). Eventually, the light will impinge on the back surface of the semiconductor substrate, where it will undergo a specular reflection, according to the above equation. This specular reflection will cause some light to be reflected back towards the bottom DBR mirror, thereby forming a fabry-perot cavity (or etalon) between the back surface of the semiconductor substrate and the bottom DBR mirror. This etalon will inevitably couple with the laser cavity itself so as to affect the stable modes of the laser cavity. This effect may cause undesirable instabilities in the laser operation, such as mode-hopping, in which the laser optical field oscillates between two competing cavity modes. Other dynamic effects may also adversely affect the ability of the laser to be rapidly switched on and off, which may limit the application of the laser for some purposes, such as telecommunications or laser-based spectroscopic sensing.

For this reason, it is desirable to be able to limit the specular reflection of light from the back surface of the semiconductor substrate in a VCSEL.

One possible way to limit this specular reflection of light is to select an absorbing material for the semiconductor substrate so that any light that leaks out of the laser cavity through the bottom DBR mirror will be absorbed nearly completely before reaching the back surface of the substrate. However, the choice of substrate is already constrained by many factors in the laser design, such as lattice-matching to the DBR and active region materials, and electrical requirements such as the necessity to provide adequate doping to allow current to flow through the substrate material. In addition, since the substrate itself is often only several thousandths of an inch thick (typically 20 mils or 500 micrometers), it may be difficult to select a material with a sufficiently high absorption to reduce the amount of specular reflection to an acceptable level.

There is therefore a need for improved methods and apparatus for reducing specular reflection of light into the laser cavity of a VCSEL.

SUMMARY OF THE INVENTION

The present invention is directed to a VCSEL and method of fabricating same. First, a substrate with a back surface and a front surface is provided. Then, a first reflector, an active region, and a second reflector are disposed on the substrate. The first reflector is disposed on the front surface. The active region is interposed between the first reflector and the second reflector. Then, anti-reflection features are formed into the back surface of the substrate to reduce specular reflection of light into the active region and the laser cavity.

Another embodiment of the present invention is directed to a VCSEL that includes a substrate with a back surface and a front surface. It also includes a first reflector disposed on the front surface of the substrate, an active region disposed on the first reflector, and a second reflector disposed on the active region such that the active region is interposed between the first reflector and the second reflector. The back surface of the substrate includes anti-reflection features for reducing specular reflection of light into the active region.

Another embodiment is directed to an array of VCSELs, each VCSEL having: a substrate with a back surface and a front surface; a first reflector disposed on the front surface of the substrate; an active region disposed on the first reflector; and a second reflector disposed on the active region such that the active region is interposed between the first reflector and the second reflector. The back surface of the substrate comprises anti-reflection rows that have substantially triangular cross-sections. The angles of the substantially triangular cross-sections are arranged to reflect light away from the active region of each VCSEL.

Another embodiment in accordance with the present invention discloses a method of conditioning a semiconductor substrate. The method includes the step of forming anti-reflection features on the back surface of the substrate.

Another embodiment in accordance with the present invention discloses an apparatus for conditioning the back surface of a semiconductor substrate in the presence of an etching solution. The apparatus includes a line-focused laser beam generator for generating and applying a line-focused laser beam to the back surface of the semiconductor substrate; a holder positioned under the line-focused laser beam generator, in which the holder holds the semiconductor substrate in place while the semiconductor substrate is being conditioned; and a controller communicably linked to the line-focused laser beam generator, in which the controller controls the relative movement between the line-focused laser beam generator and the semiconductor substrate on the holder so as to form anti-reflection features on the back surface of the semiconductor substrate.

An advantage of the present invention is that it reduces the amount of specular reflection of light from the back surface of the semiconductor substrate into the active region of the VCSEL.

Another advantage is that a VCSEL in accordance with the present invention will have more stable modes of laser cavity than its conventional peer, thus enabling a more stable laser operation.

Another advantage of the present invention is that it reduces mode hopping in the laser cavity of the VCSEL.

Other and further features and advantages will be apparent from the following description of presently preferred embodiments of the invention, given for the purpose of disclosure and taken in conjunction with the accompanying drawings. Not all embodiments of the invention will include all the specified advantages.

BRIEF DESCRIPTION OF THE DRAWINGS

Other features and advantages of the invention will become apparent upon study of the following description, taken in conjunction with the attached FIGS. 1–7.

DETAILED DESCRIPTION OF THE INVENTION

Figure 1:
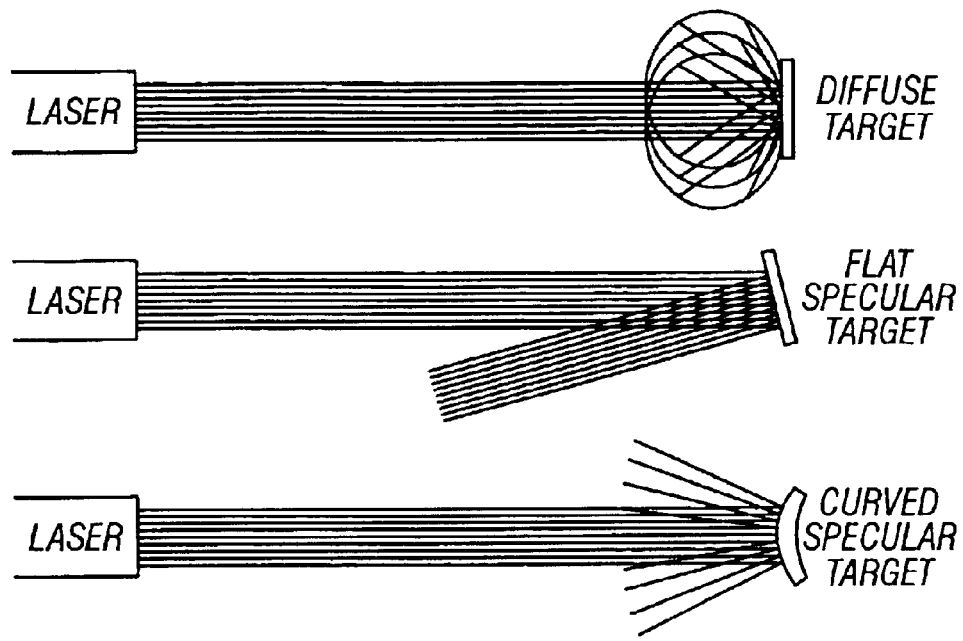
FIG. 1 illustrates various types of laser reflections.
Figure 2:
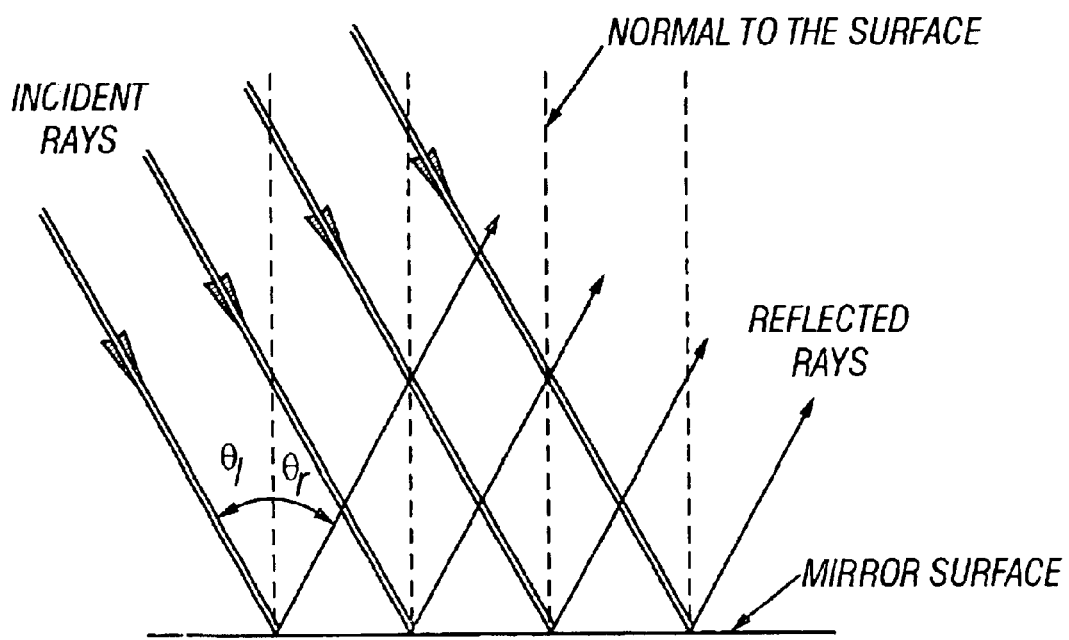
FIG. 2 illustrates specular reflection from a polished mirror surface.
Figure 3:
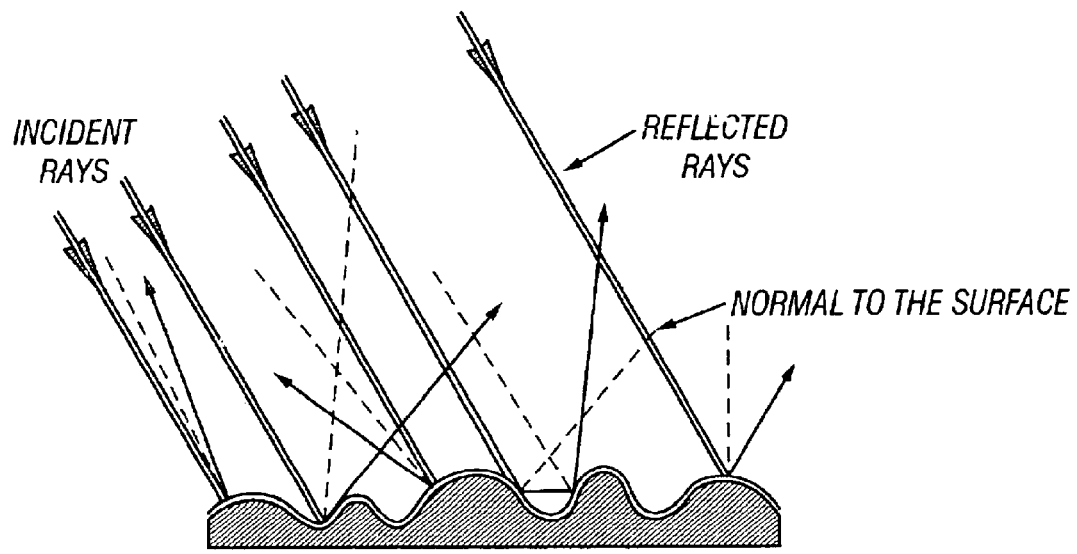
FIG. 3 illustrates diffuse reflection from a corrugated surface.

Referring now to the drawings, the details of preferred embodiments of the invention are schematically illustrated.

Figure 4:
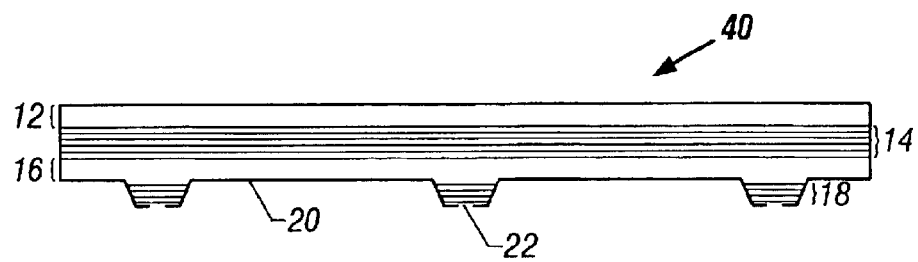
FIG. 4 illustrates a cross-sectional view of a one-dimensional array of VCSELs.

As noted above, the subject of this invention is a VCSEL and method for fabricating same so as to reduce specular reflection of light from the back surface of the semiconductor substrate that couples into the laser cavity of a VCSEL. Referring now to FIG. 4, a one-dimensional array 40 of VCSELs is shown in cross-section, the cross-sectional view illustrating three VCSELs of VCSEL array 40. Array 40 is a one-dimensional (linear) array having a single row of N VCSELs. As will be appreciated, a VCSEL is a semiconductor laser that emits its output perpendicular to its p-n junction. Each VCSEL is built on a substrate 12 of semiconductor material. Various semiconductor materials known to those in the art can be employed.

Each VCSEL shares a first reflector 14. In one embodiment, the first reflector 14 comprises a DBR. A DBR consists of alternating layers of different semiconductors or different dielectrics. In one embodiment, forty alternating layers yield a reflectivity of 99.99%.

Each VCSEL also shares the common active region 16 of VCSEL array 40. The active region 16 is a p-n junction and the width of the active region 16 controls the wavelength of emitted light. The widths of the first reflector 14, active region 16, and second reflector 18 are very small compared to the width of the substrate 12. (The widths shown for the various layers in FIG. 4 are not to scale.)

In the embodiment shown in FIG. 4, the second reflector 18 is separate for each VCSEL. In another embodiment, the VCSELs can share a common second reflector 18. In an embodiment, the second reflector 18 comprises a DBR. The second reflector 18 is highly reflective, but preferably less reflective than the first reflector 14. In one embodiment, twenty-five alternating layers of a DBR yield a reflectivity of 99.9%.

A cladding 20 protects the VCSEL structure. Adjacent the second reflector 18, the cladding 20 defines a gap 22 that allows emission of radiation from the active region 16. The profile of the emitted radiation can be controlled by modifying the geometry of the emission area. For example, changes in the shape and size of the gap 22 affect the spatial profile of the emitted radiation. The distance between the active region 16 and the gap 22 also affects the spatial profile of the emitted radiation. The use of photolithographic techniques in defining the features of the VCSEL array allow highly accurate placing of the VCSELs and highly accurate definition of VCSEL output profiles.

Figure 5:
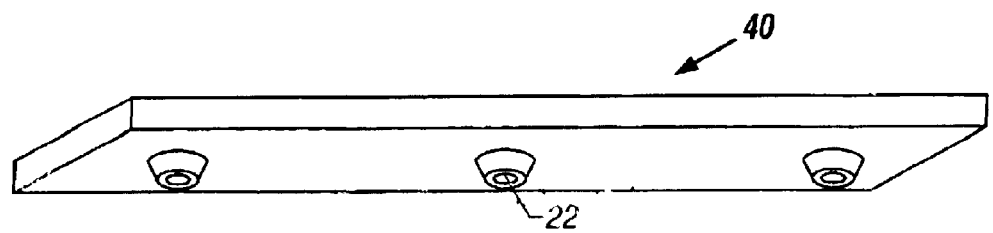
FIG. 5 is an isometric view of the one-dimensional array of VCSELs of FIG. 4.

Referring now to FIG. 5, an isometric view of a linear array 40 of VCSELs is depicted. Most of the structural aspects of the VCSELs are not visible from an outside view. The gaps 22 are visible and allow radiation to be emitted. As with FIG. 4, the dimensions have been rendered disproportional in order to make visible the various features. In various embodiments, the VCSEL separation and height are much reduced relative to the thickness of the substrate. FIG. 5 shows a linear array 40 of VCSELs manufactured such that radiation from each VCSEL is emitted along substantially parallel paths. While the array shown has three VCSELs, other embodiments include arrays having a large number of linearly arranged VCSELs.

Figure 6:
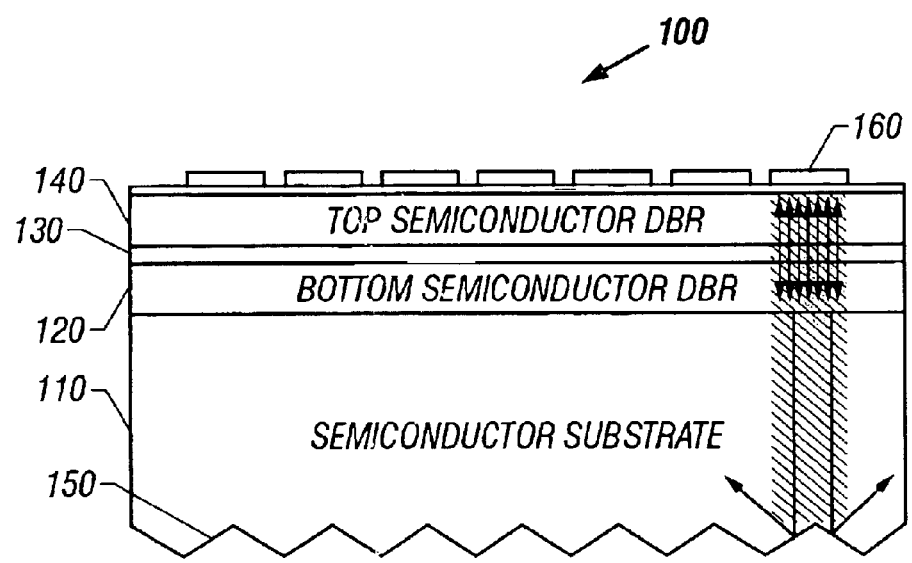
FIG. 6 illustrates a schematic diagram of an array of VCSELs in accordance with an embodiment of the present invention.

Referring now to FIG. 6, a cross-sectional view of an array of VCSELs 100 in accordance with an embodiment of the present invention is illustrated. Array 100 is a one-dimensional (linear) array having a single row of N VCSELs. Each VCSEL is built on a substrate 110 of semiconductor material.

Each VCSEL, e.g., VCSEL 160, shares a first reflector 120. In one embodiment, the first reflector 120 comprises a DBR. Each VCSEL also shares the common active region layer 130 of VCSEL array 100. Active region layer 130 contains several VCSEL active regions. The widths of the first reflector 120, active region layer 130, and the second reflector 140 are very small compared to the width of the substrate 110. (The widths shown for the various layers in FIG. 6 are not to scale.) In the embodiment shown in FIG. 6, each VCSEL, e.g., VCSEL 160, also shares a common second reflector 140. In another embodiment, the second reflector 140 is separate for each VCSEL. Like the first reflector 120, the second reflector 140 can comprise a DBR.

As illustrated in FIG. 6, anti-reflection features 150 are formed on the back surface of the semiconductor substrate 110 to reduce specular reflection of light into the active region of each VCSEL. In one embodiment, the anti-reflection features 150 are specifically designed to reflect light off the back surface of the substrate 110 away from the active region of each VCSEL, e.g., VCSEL 160, thus reducing the undesired coupling of the specular reflection of light into the active region of each VCSEL. In an embodiment, the anti-reflection features 150 are anti-reflection rows. In accordance with another embodiment, the anti-reflection rows have periodical and geometric cross-sections, such as triangular, sinusoidal, etc. The geometric cross-sections can be in any shape so long as they reduce specular reflection of light into the active region or laser cavity of the VCSEL.

In one embodiment, the anti-reflection features 150 are anti-reflection rows with substantially triangular cross-sections. In accordance with another embodiment, the rows are designed to only have one to two triangular cross-sections under each VCSEL, e.g., VCSEL 160. The triangular cross-sections may be of any form of triangle, such as isosceles, equilateral, right triangles, etc. In an embodiment, the angles of the triangular cross-sections are designed such that light is reflected away from the VCSELs in the array 100. The angles of the triangular cross-sections may also be designed to reduce the amount of specular reflection of light in parallel with the light generated in the active region.

In one embodiment, the anti-reflection features 150 create diffuse reflection of light as opposed to specular reflection of light. In yet another embodiment, the anti-reflection features 150 are mechanically designed such that the specular reflection of light from the back surface of the substrate 110 impinges on the active region layer 130 outside of the active (pumping) region for each VCSEL, i.e., the specular reflection of light will be efficiently absorbed. The present invention may be utilized regardless of the pumping scheme (e.g., optical or electrical) employed in the VCSEL.

The anti-reflection features 150 may be formed on the back surface of the substrate 110 by various methods. These features 150 may be formed, e.g., mechanically or chemically. In accordance with an embodiment of the present invention, the anti-reflection features 150 are formed into the back surface of the substrate by etching the features 150 into the back surface using a selective wet etching solution. Such a solution would preferentially etch the semiconductor substrate 110 along one crystal axis. In this way, a substantially triangular cross-section would be created, as illustrated in FIG. 6. The angles of the triangle would be determined by the etch chemistry used and the relative rate of etch along the various crystal planes. These angles could not be altered without altering the etching chemistry and/or orientation of the VCSELs with respect to the substrate crystal planes.

In accordance with another embodiment of the present invention, the anti-reflection features 150 are etched by a photoelectrochemical process. In this process, the substrate is typically in the presence of an etching solution, e.g., immersed in an etching solution in a vat, and the rate of etching is enhanced (i.e. augmented) by the presence of light. Under certain conditions the etching rate can be controlled within a range by varying the intensity of the light so that the regions with higher light intensity would etch faster than those with lower light intensity. In this way, appropriate optics could be designed to create the desired pattern of light intensity so that the desired etching profile is created. Various photoelectrochemical etching techniques are discussed in Ostermayer, et al. "Photoelectrochemical etching of integral lenses on InGaAsP/InP light-emitting diodes," *Appl. Phys. Lett.*, Vol. 43, No. 7, Oct. 1, 1983, pp. 642–644. This article is incorporated herein by reference.

Another embodiment of the present invention discloses one type of photoelectrochemical etching, in which the anti-reflection features 150 are etched on the back surface by scanning the back surface with a line-focused laser beam whose speed is varied by a computer. In accordance with another embodiment, the back surface is exposed to an etching solution prior to scanning it with the line-focused laser beam. In the substrate regions where the line is scanned the fastest, the amount of material etched away is lowest, while in the substrate regions where the speed is the slowest, the etching rate is the highest. That is, the anti-reflection features 150 have the deepest cross-sections when the speed is slowest and the shallowest cross-sections when the speed is fastest. Thus, by sinusoidally varying the scanning speed of the beam, for example, a substantially sinusoidal etch profile is created. In accordance with an embodiment of the present invention, the anti-reflection features 150 have arbitrary linearly symmetric cross-sections.

Figure 7:
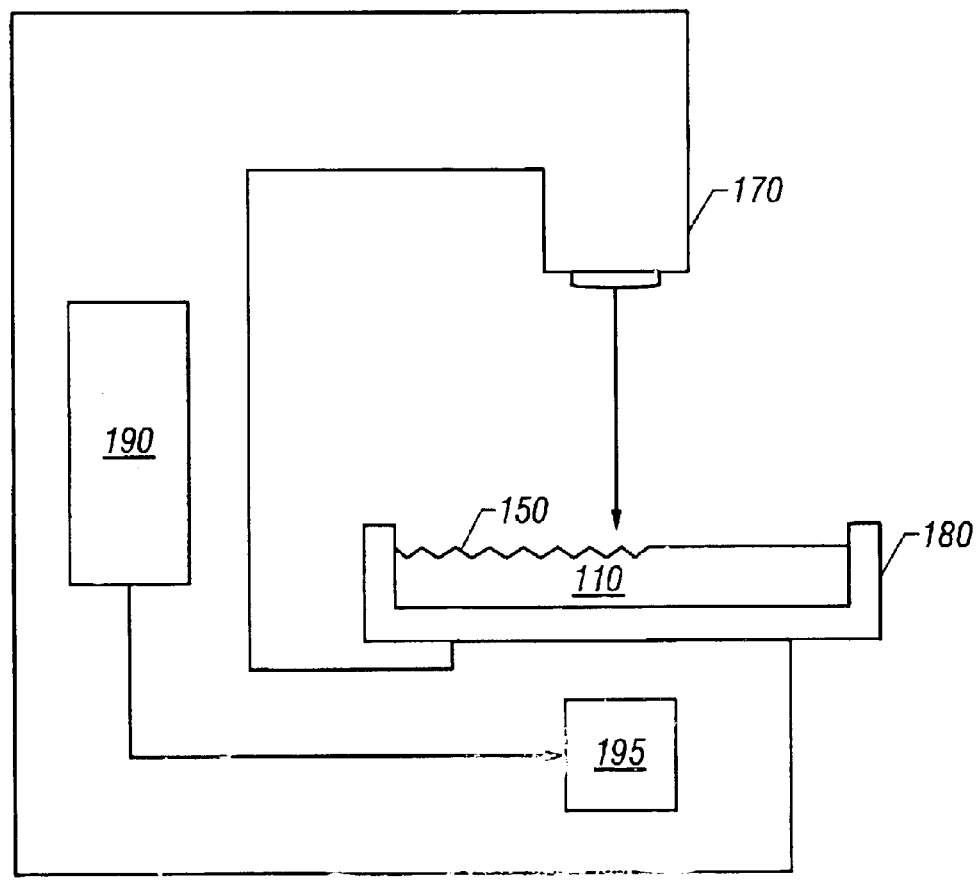
FIG. 7 illustrates a schematic diagram of an apparatus for conditioning a semiconductor substrate in accordance with an embodiment of the present invention.

As shown in FIG. 7, an apparatus for conditioning a semiconductor substrate 110 in accordance with this embodiment includes a line-focused laser beam generator 170 for generating and applying a line-focused laser beam to the back surface of the semiconductor substrate 110 (in the presence of an etching solution) and a device 180 that holds the semiconductor substrate in place while the semiconductor substrate 110 is being conditioned. The holder device 180 is typically positioned under the line-focused laser beam generator. In one embodiment, the holder device 180 includes a vat filled with an etching solution such that the back surface of the substrate 110 is in the presence of the etching solution. The apparatus further includes a controller 190 for controlling the relative movement between the line-focused laser beam generator 170 and the semiconductor substrate 110 so as to form anti-reflection features 150 on the back surface of the semiconductor substrate 110. In one embodiment, the controller 190 moves the holder device 180, using a motor 195 under the control of the controller 190, along with the semiconductor substrate 110 positioned therein relative to the line-focused laser beam generator 170. In another embodiment, the controller 190 moves the line-focused laser beam generator 170 relative to the semiconductor substrate 110 positioned in the holder device 180.

Although the present invention is described with respect to an array 100 of VCSELs, the present invention is equally applicable to a single VCSEL.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A VCSEL comprising:
    a substrate having a back surface and a front surface;
    a first reflector disposed on the front surface of the substrate;
    an active region disposed on the first reflector; and
    a second reflector disposed on the active region such that the active region is interposed between the first reflector and the second reflector, wherein the back surface of the substrate comprises periodic row reflection means for causing a specular reflection of light impinging on said period row reflection means from the active region which specular reflection of light is directed away from said active region thereby reducing specular reflection of light into the active region.

2. The VCSEL of claim 1, wherein the periodic row reflection means comprise rows having a triangular cross section.

3. The VCSEL of claim 1, wherein the periodic row reflection means are etched on the back surface using a selective wet etching solution.

4. The VCSEL of claim 1, wherein the periodic row reflection means are etched on the back surface by photoelectrochemical etching.

5. The VCSEL of claim 4, wherein the periodic row reflection means are etched on the back surface by scanning the back surface with a line-focused laser.

6. An array of VCSELs sharing a common substrate, each VCSEL comprising:
    a substrate having a back surface and a front surface;
    a first reflector disposed on the front surface of the substrate;
    an active region disposed on the first reflector, and
    a second reflector disposed on the active region such that the active region is interposed between the first reflector and the second reflector, wherein the back surface of the substrate comprises periodic row reflection means for causing a specular reflection of light impinging on said period row reflection means from the active region which specular reflection of light is directed away from said active region thereby reducing specular reflection of light into the active region of each VCSEL.

7. The array of claim 6, wherein the periodic row reflection means comprise rows having a triangular cross section.

8. The VCSEL of claim 2, wherein the triangular cross section of the rows of the periodic row reflection means is such that light directed onto the period row reflection means from the active region is reflected away from the active region.

9. The VCSEL of claim 1, wherein the periodic row reflection means comprise rows having a sinusoidal cross section.

10. The VCSEL of claim 7, wherein the triangular cross section of the rows of the periodic row reflection means is such that light directed onto the period row reflection means from the active region is reflected away from the active region.

11. The VCSEL of claim 6, wherein the periodic row reflection means comprise rows having a sinusoidal cross section.

12. The VCSEL of claim 6, wherein the periodic row reflection means are etched on the back surface using a selective wet etching solution.

13. The VCSEL of claim 6, wherein the periodic row reflection means are etched on the back surface by photo-electrochemical etching.

14. The VCSEL of claim 13, wherein the periodic row reflection means are etched on the back surface by scanning the back surface with a line-focused laser.

* * * * *